United States Patent
Yanagisawa et al.

[11] Patent Number: 6,159,388
[45] Date of Patent: Dec. 12, 2000

[54] PLASMA ETCHING METHOD AND PLASMA ETCHING SYSTEM FOR CARRYING OUT THE SAME

[75] Inventors: Michihiko Yanagisawa; Shinya Iida, both of Ayase; Yasuhiro Horiike, Houya, all of Japan

[73] Assignee: Speedfam Co., Ltd., Tokyo, Japan

[21] Appl. No.: 09/013,705

[22] Filed: Jan. 26, 1998

[30] Foreign Application Priority Data

Feb. 18, 1997 [JP] Japan .................................. 9-049863

[51] Int. Cl.$^7$ ...................................................... H01L 21/00
[52] U.S. Cl. ............................................. 216/60; 156/345
[58] Field of Search ................................ 216/60; 156/345

[56] References Cited

U.S. PATENT DOCUMENTS

| | | | |
|---|---|---|---|
| 4,454,001 | 6/1984 | Sternheim et al. | 216/60 |
| 4,838,694 | 6/1989 | Betz et al. | 216/60 |
| 5,254,830 | 10/1993 | Zarowin et al. | 156/345 |
| 5,376,224 | 12/1994 | Zarowin . | |
| 5,450,205 | 9/1995 | Sawin et al. | 216/60 |
| 5,795,493 | 8/1998 | Bukhman et al. | 216/60 |

FOREIGN PATENT DOCUMENTS 5-160074  6/1993  Japan .
6-5571   1/1994  Japan .

*Primary Examiner*—Kishor Mayekar
*Attorney, Agent, or Firm*—Snell & Wilmer, LLP

[57] ABSTRACT

Plasma etching method and apparatus for removing relatively thick portions from wafers by etching while measuring an actual etch quantity to thereby manufacture the wafers excellent in flatness quality on a mass-production basis. A conduit 20 of a plasma generator 2 is positioned above a relatively thick portion 111 of the wafer 110 to etch away a wafer material from the relatively thick portion 111 by ejecting a fluorine gas G. A laser beam L0 is emitted from a laser displacement meter 30 of a measuring apparatus 3 to detect an interference state between a reflected light beam L1 from the relatively thick portion 111 and a reflected light beam L2 form a reflecting plate 32 and count periodical changes of the interference state. When the count value m coincides with an integral value derived by dividing a desired etch quantity by a half wavelength of the laser beam L0, etching of the relatively thick portion 111 by the fluorine gas G is terminated.

15 Claims, 13 Drawing Sheets

PLASMA ETCHING METHOD AND PLASMA ETCHING SYSTEM FOR CARRYING OUT THE SAME

BACKGROUND OF THE INVENTION

1. Field of the Invention

The present invention relates generally to a plasma etching method of locally etching a relatively thick portion of an article such as a wafer for enhancing flatness or planarization of the article. The invention is also concerned with a plasma etching system for carrying out the method mentioned above.

2. Description of Related Art

Techniques for etching a surface of an article such as that of a silicon wafer or the like are generally known. For example, there are known methods of machining or polishing the whole surface of the wafer by exposing it to a gas of activated species produced through excitation to a plasma state, methods of forming circuit patterns by etching those regions exposed through a mask with a gas of activated species and so forth.

In recent years, there have also been developed techniques for eliminating geometrical variations such as total thickness variation (TTV for short), local thickness variation (LTV in abbreviation) and the like by removing relatively thick portions formed in a surface of an article of concern such as a silicon wafer and a silicon-on-insulator device (SOI for short) in place of the techniques for etching the whole surface of the article such as a wafer. For more particulars, reference may be made, for example, to the technique disclosed in Japanese Unexamined Patent Application Publication No. 5571/1994 (JP-A-6-5571).

For having better understanding of the concept underlying the invention, description will first be made in some detail of the technical background thereof. FIG. 20 of the accompanying drawings is a schematic diagram for illustrating the principle of a conventional plasma etching system known heretofore.

Referring to FIG. 20, reference numeral 100 denotes a plasma generator. A gas G of activated species (hereinafter also referred to simply as the activated gas) contained in the plasma produced by the plasma generator 100 is jetted or ejected from a nozzle 101 onto a surface of a wafer 110, a typical one of the articles which are to undergo etching process.

The wafer 110 is fixedly disposed on a stage 120. By moving or displacing a stage 120 in a horizontal direction, a portion 111 of the wafer 110 which is relatively thicker than a prescribed dimension (this portion is referred to as the relatively thick portion for the convenience of description) is placed at a position immediately beneath the nozzle 101.

Subsequently, the activated gas G is ejected against the relatively thick portion 111 of a convex shape from the nozzle 101, to thereby etch away locally that portion 111. In this way, the surface of the wafer 110 is flattened or planarized.

In this conjunction, it is however noted that the thickness of the relatively thick portion 111 of the wafer 110 is not always uniform but usually diversified.

Under the circumstances, there has been developed a plasma etching system which is so arranged as to control a dwell time of the nozzle 101 (i.e., a time for which the nozzle 101 is caused to stay above the relatively thick portion) in dependence on the thickness of the relatively thick portion 111. By way of example, reference may be made to Japanese Unexamined Patent Application Publication No. 160074/1993 (JP-A-5-160074). According to this known etching technique, the position and the thicknesses of the relatively thick portions 111 are measured over the whole surface of the wafer 110 to thereby prepare corresponding data. The data are then translated into position/dwell-time map data indicating the position(s) of the relatively thick portion(s) 111 and the dwell time of the nozzle 101 which allows a desired degree of flatness to be realized by removing the relatively thick portion 111 through the etching process.

On the basis of the position/dwell-time map data, the stage 120 is so controlled as to move the nozzle 101 to a position immediately above a predetermined relatively thick portion 111 to cause the nozzle 101 to stay at that position for a predetermined dwell time. In this manner, the relatively thick portion 111 can be removed by a desired etch quantity. In this conjunction, with the term "etch quantity", it is contemplated to mean a quantity indicating an amount of wafer material removed by etching.

More specifically, for the relatively thick portion 111 having a greater thickness, the dwell time of the nozzle 101 is extended to thereby increase the etch quantity, while for the relatively thick portion 111 of a smaller thickness, the dwell time of the nozzle 101 is shortened to decrease correspondingly the etch quantity, in an effort to realize planarization over the whole surface of the wafer 110.

The conventional plasma etching technique mentioned above however suffers a problem that due to variations of ambient or environmental parameters such as plasma parameters, realization of the planarization as desired encounters a great difficulty and it is rendered impossible in some case.

In this conjunction, it is noted that the conventional plasma etching technique is based on the presumption that the rate of etching reaction with the activated gas G ejected or jetted from the nozzle 101 is constant and hence the amount of material removed per unit time, i.e., etching rate, is always constant.

In practical applications, however, the ambient or environmental factors such as the plasma parameters are likely to vary, which, of course, brings about variations in the density of the activated gas G as well as in the reaction rate on the surface of the wafer 110. To say in another way, such situations may arise that the etch quantity becomes large or small even for a same dwell time, involving nonuniformity in the surface flatness of the finished wafer.

Thus, in manufacturing wafers on a mass-production basis, there will be apparent dispersions or variations in the flatness quality of the finished wafers 110 such as TTV (Total Thickness Variation), LTV (Local Thickness Variation) and the like.

SUMMARY OF THE INVENTION

In the light of the state of the art described above, it is an object of the present invention to provide a plasma etching method which is capable of manufacturing wafers on a mass-production basis while avoiding dispersions or variations in respect to the flatness quality of the wafers by resorting to an etching process carried out by actually measuring the etched quantity at a relatively thick portion or portions of the wafer.

Another object of the present invention is to provide a plasma etching system for carrying out the method mentioned above.

In view of the above and other objects which will become apparent as the description proceeds, there is provided according to a first general aspect of the present invention a plasma etching method of removing a relatively thick portion from a surface of an article of concern to thereby realize a desired surface flatness through an etching process by ejecting a gas of activated species onto the relatively thick portion from a jet nozzle of a plasma generating means disposed substantially in opposition to the relatively thick portion. The method includes a first step of measuring an actual etch quantity of the relatively thick portion by using a laser light beam, and a second step of terminating the etching of the relatively thick portion when the actual etch quantity has a predetermined value.

According to the plasma etching method mentioned above, the relatively thick portion of article or wafer of concern is deformed gradually or progressively as the material is removed from the relatively thick portion due to etching under the action of the gas of activated species ejected from the jet nozzle of the plasma generating means. In the meanwhile, the etch quantity of the relatively thick portion is measured in the first step. When this etch quantity has attained the predetermined value, the etching process for the relatively thick portion of the wafer is terminated or stopped in the second step.

In a first preferred mode for carrying out the invention directed to the plasma etching method mentioned above, the first step may include a step of setting previously an integral value obtained by dividing an etch quantity desired for flattening substantially the surface of the article by etching the relatively thick portion by a half wavelength of the laser light, and a step of irradiating a predetermined reflecting surface and a surface of the relatively thick portion with the laser light beam and measuring a number of times interference state between a reflected light beam from the reflecting surface and a reflected light beam from the surface of the relatively thick portion changes periodically in dependence on actual etch quantity of the relatively thick portion, while the second step may include a step of terminating the etching of the relatively thick portion when the number of times the interference state has changed coincides with the aforementioned integral value.

In a second preferred mode for carrying out the invention directed to the plasma etching method, the first step may include a step of setting previously the etch quantity desired for flattening substantially the surface of the article by removing the relatively thick portion by irradiating a predetermined reflecting surface and a surface of the relatively thick portion, respectively, with the laser light beam and a step of converting an interference light beam produced due to interference between a reflected light beam from the predetermined reflecting surface and the surface of the relatively thick portion into an electric signal, a step of setting a reference function representing a relation of the electric signal and the etch quantity, and a step of generating a shift function representing a predicted relation between the electric signal and the etch quantity by shifting the reference function on the basis of an initial value of the electric signal upon etching of the relatively thick portion to thereby determine the actual etch quantity by assigning values of the electric signal successively to the shift function, while the second step may include a step of terminating the etching of the relatively thick portion when the actual etch quantity and the desired etch quantity substantially coincide with each other.

Further provided according to a second general aspect of the invention is a plasma etching system which comprises a plasma generating means including a jet nozzle for ejecting a gas of activated species produced by excitation to a plasma state onto a predetermined relatively thick portion of an article of concern, a measuring means for measuring actually an etch quantity of the relatively thick portion by using a laser light beam, and a control means for comparing the actual etch quantity as measured by the measuring means with a predetermined value, wherein the control means is configured to terminate the etching process for the relatively thick portion when the actual etch quantity coincides with the predetermined value.

With the arrangement of the plasma etching system described above, the relatively thick portion on the article or wafer is etched with the surface thereof being deformed or displaced under the action of the gas of activated species excited to the plasma state and ejected onto the relatively thick portion. In the meanwhile, the etch quantity is measured by the measuring means. The etch quantity measured by the measuring means is compared with the predetermined value by the control means, and the etching operation for the relatively thick portion is stopped or terminated when coincidence is detected between the actually measured etch quantity and the predetermined value therefor.

In a third mode for carrying out the invention directed to the plasma etching system described above, the measuring means may be so arranged that a laser light beam of a predetermined wavelength is projected onto a predetermined reflecting surface and a surface of the relatively thick portion, respectively, to receive a reflected light beam from the predetermined reflecting surface and a reflected light beam reflected from the surface of the relatively thick portion to thereby detect a number of times interference states between both the reflected light beams changes periodically in correspondence to the actual etch quantity of the relatively thick portion. On the other hand, the control means may be so arranged that when an integral value obtained by dividing the etch quantity desired for substantially flattening the surface of the article by removing the relatively thick portion by a half wavelength of the laser light beam coincides with the number of times the interference state has periodically changed, the etching process for the relatively thick portion is terminated.

In a fourth preferred mode for carrying out the invention directed to the plasma etching system, the measuring means may include a first laser displacement meter for sending and receiving the laser light beam to thereby measure the number of times the interference state between the received laser light beams changes periodically, a half mirror interposed between the first laser displacement meter and the jet nozzle of the plasma generating means for directing the laser light beam onto the relatively thick portion by way of the jet nozzle, the half mirror being additionally so arranged as to direct the reflected light beam from the relatively thick portion to the first laser displacement meter by way of the jet nozzle, and a reflecting plate disposed in opposition to the first laser displacement meter with the half mirror being interposed between the reflecting plate and the first laser displacement meter.

In a fifth preferred mode for carrying out the invention directed to the plasma etching system, a displacing means may further be provided for moving either the article of concern or the jet nozzle, wherein the control means may include a recording medium for storing data concerning the integral values corresponding to individual relatively thick portions and positions thereof, respectively, and a controller for reading out the position data to thereby control the displacing means so that the jet nozzle is positioned in opposition to the relatively thick portion located at the position corresponding to the position data as read out and put into operation the measuring means, whereon the controller compares the integral value with the number of times the interference has changed as outputted from the measuring means to thereby stop operation of the measuring means when the comparison results in coincidence while reading out a succeeding one of the position data to thereby control the displacing means so that the jet nozzle is positioned in opposition to the relatively thick portion corresponding to the succeeding position data.

In a sixth preferred mode for carrying out the invention directed to the plasma etching system mentioned above, the measuring means may be so arranged as to project the laser light beam of a predetermined wavelength onto a predetermined reflecting surface and the surface of the relatively thick portion, respectively, and convert an interference light produced as a result of interference between a reflected light beam from the predetermined reflecting surface and a reflected light beam from the surface of the relatively thick portion into an electric signal, to generate a shift function representing an expected relation between the electric signal and the etch quantity by shifting a reference function representing a preset relation between the electric signal and the etch quantity by a predetermined quantity on the basis of an initial value of the electric signal in the etching process, for thereby determining the actual etch quantity by assigning values of the electric signal obtained progressively to the shift function. The control means terminates the etching process for the relatively thick portion when the actual etch quantity substantially coincides with the desired etch quantity.

In a seventh preferred mode for carrying out the invention directed to the plasma etching system described previously, the measuring means may include a photoelectric transducer unit for converting the interference light beam between the reflected laser light beams as mentioned above, a reference function storage means for storing the predetermined reference function representing the relation between the electric signal and the etch quantity, a shift function generating unit for generating a relation expected between the electric signal and the etch quantity by shifting the reference function by a predetermined phase on the basis of the electric signal outputted from the photoelectric transducer unit, and a second laser displacement meter for determining the actual etch quantity by assigning values of the electric signal outputted from the photoelectric transducer unit to the shift function, a half mirror interposed between the second laser displacement meter and the jet nozzle of the plasma generating means for directing the laser light beam onto the relatively thick portion by way of the jet nozzle, the half mirror being additionally so arranged as to direct the reflected light beam from the relatively thick portion to the second laser displacement meter by way of the jet nozzle, and a reflecting plate disposed in opposition to the second laser displacement meter with the half mirror being interposed between the reflecting plate and the second laser displacement meter.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

Figure 1:
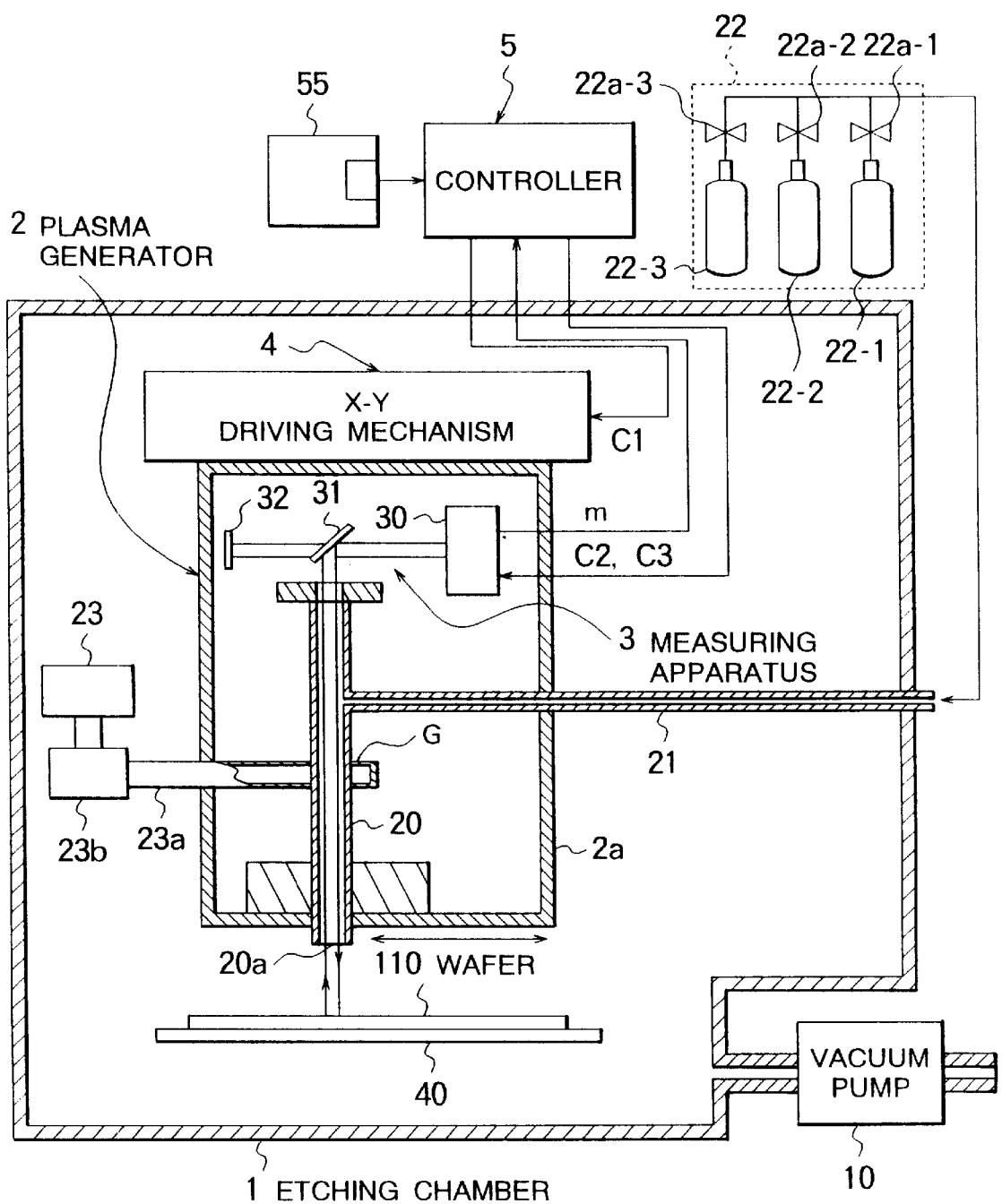
FIG. 1 is a view showing schematically a structure of a plasma etching system according to a first embodiment of the present invention.

Now, the present invention will be described in detail in conjunction with what is presently considered as preferred or typical embodiments thereof by reference to the drawings. In the following description, like reference characters designate like or corresponding parts throughout the several views. Also in the following description, it is to be understood that such terms as "downward", "upward", "left", "right", "horizontal", "vertical" and the like are words of convenience and are not to be construed as limiting terms.

Embodiment 1

FIG. 1 is a view showing schematically a structure of a plasma etching system according to a first embodiment of the present invention.

The plasma etching system now under consideration comprises a plasma generating means in the form of a plasma generator 2 disposed within an etching chamber 1 the interior of which is maintained at ca. 1 Torr by means of a vacuum pump 10, a measuring means in the form of a measuring apparatus 3 built in the plasma generator 2, a moving means in the form of an X-Y driving mechanism 4 and a control means in the form of a controller 5.

The plasma generator 2 includes a conduit 20 made of quartz, a gas supply source 22 for supplying a gas to the conduit 20 by way of a feed pipe 21 and a microwave oscillator 23 installed on the conduit 20.

More specifically, the conduit 20 is fixedly mounted within a casing 2a and has a jet nozzle 20a directed or oriented toward a stage 40. The gas supply source 22 includes a plurality of gas cylinders 22-1, 22-2 and 22-3 equipped with regulating valves 22a-1, 22a-2 and 22a-3, respectively, wherein the gas cylinders 22-1, 22-2 and 22-3 contain gases of $CF_4$ (carbon tetrafluoride), $O_2$ (oxygen) and Ar (argon), respectively. The microwave oscillator 23 may be constituted by a magnetron having a rated output of 500 W. Microwave energy emitted from the microwave oscillator 23 is injected into a plasma region formed within the conduit 20 by means of a waveguide 23a. A tuner 23b is provided for the purpose of adjusting the phase of the microwave.

With the arrangement of the plasma etching system described above, a gas mixture containing $CF_4$, $O_2$ and Ar in a predetermined composition ratio is supplied to the conduit 20. On the other hand, the microwave of predetermined power is emitted by the microwave oscillator 23 to be injected into the conduit 20 at the plasma generating region, whereby plasma containing a gas G of activated species or fluorine gas is produced under the irradiation of the injected microwave, whereon the fluorine gas G flows downwardly. In this manner, the fluorine gas G is ejected or jetted toward the surface of a wafer 110, the article to be etched, from the jet nozzle 20a of the conduit 20 for performing etching process on the wafer 110.

Figure 2:
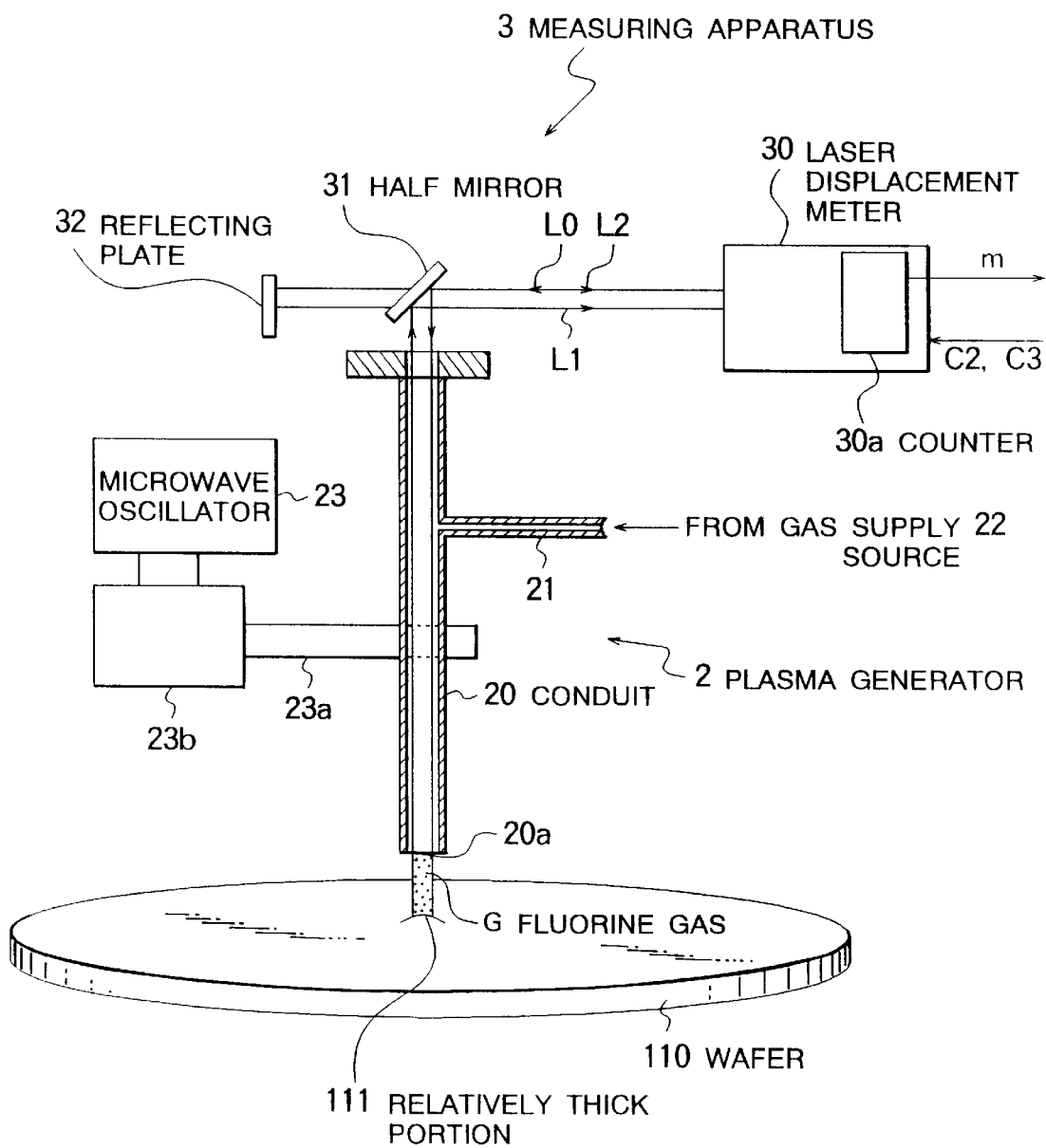
FIG. 2 is a block diagram showing schematically an arrangement of a measuring apparatus.

FIG. 2 is a view showing schematically a structure of the measuring apparatus 3 which is employed as an instrument for measuring the etch quantity on the surface of the relatively thick portion 111 of the wafer 110 in the etching process under the action of the fluorine gas G.

More specifically, the measuring apparatus 3 comprises a laser displacement meter 30 (first laser displacement meter), a half mirror 31 disposed in opposition to the laser displacement meter 30 immediately above the conduit 20 with an inclination of an angle of 45 degrees and a reflecting plate 32 disposed at a rear side of the half mirror 31 in opposition to the laser displacement meter 30.

The laser displacement meter 30 is so designed as to send and receive a laser beam emitted by a He—Ne (helium-neon) laser and having a wavelength λ of 630 nm (nanometers) for thereby measuring a number of times the interference state between reflected light beams L1 and L2 as received changes periodically.

At this juncture, the function of the laser displacement meter 30 will be described in detail.

When a laser beam L0 is emitted from the laser displacement meter 30, the laser beam L0 is reflected at the half mirror 31 to be thereby directed to the relatively thick portion 111 of the wafer 110. At the same time, a part of the laser beam L0 is directed toward the reflecting plate 32 after having transmitted through the half mirror 31.

Upon reaching the relatively thick portion 111, the laser beam L0 is reflected at the surface of the relatively thick portion 111, as a result of which a reflected light beam L1 is transmitted back to the laser displacement meter 30 by way of the half mirror 31. On the other hand, a part of the laser beam L0 having reached the reflecting plate 32 is reflected by the reflecting plate 32, resulting in that a reflected light beam L2 is also transmitted back to the laser displacement meter 30 through the half mirror 31.

Thus, the laser displacement meter 30 receives an interference light beam indicating an interference state between the reflected light beams L1 and L2.

The interference state between the reflected light beams L1 and L2 changes as a function of the etch quantity, i.e., the amount of wafer material removed from the relatively thick portion 111 and this displacement of the surface of that portion.

Figure 3A:
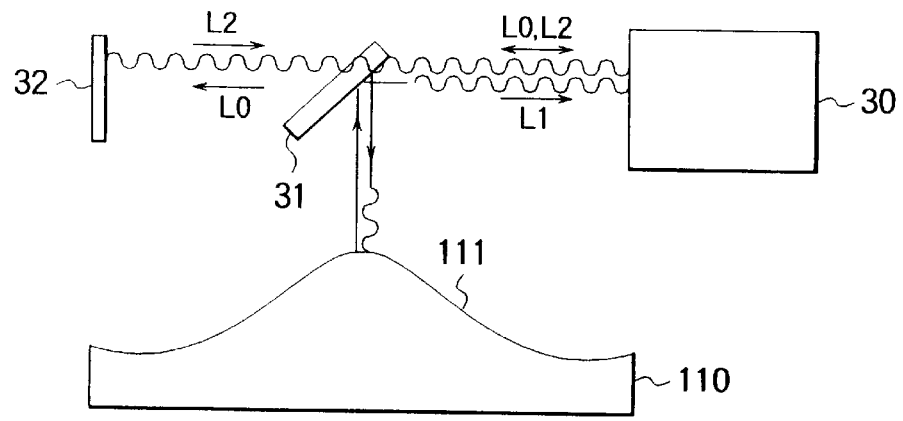
FIGS. 3A to 3C are schematic diagrams for illustrating relations between deformations or displacements of a relatively thick portion and interference states of reflected light beams, respectively.
Figure 3B:
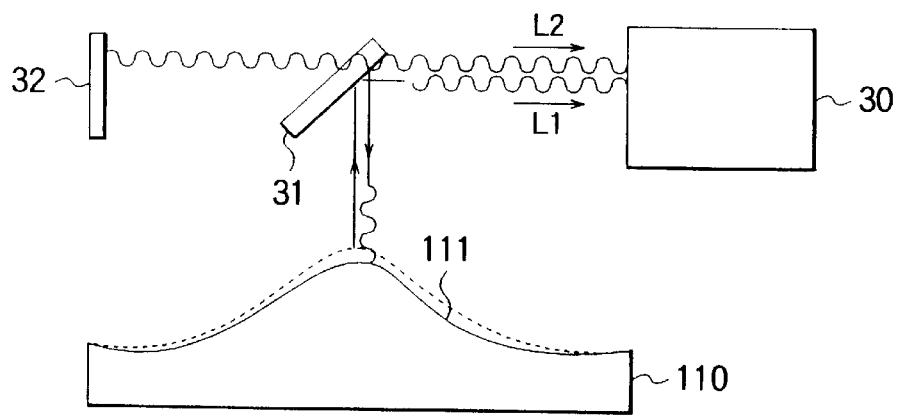
Figure 3C:
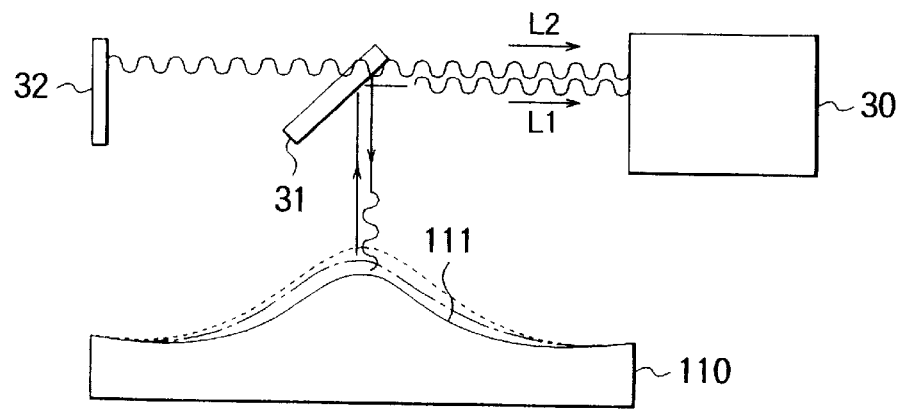
Figure 4A:
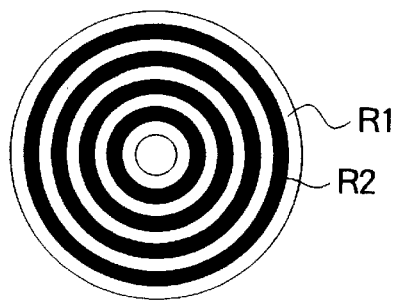
FIGS. 4A to 4C show interference fringe diagrams for illustrating periodical changes in the interference state between the reflected light beams.
Figure 4B:
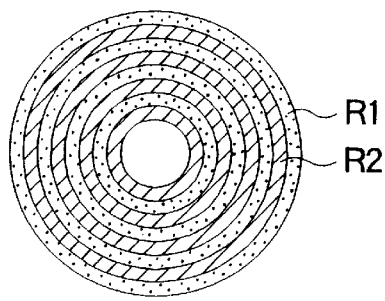
Figure 4C:
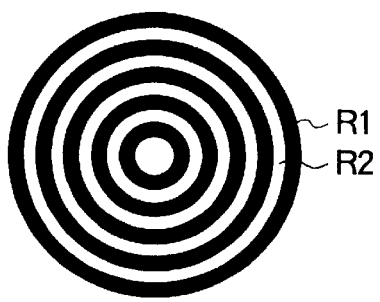

FIGS. 3A to 3C are schematic diagrams for illustrating relations between the displacement of the surface of the relatively thick portion 111 and interference states between the reflected light beams L1 and L2. Further, FIGS. 4A to 4C show interference fringe diagrams for illustrating periodical change in the interference state between the reflected light beams L1 and L2.

Assuming that the phases of the reflected light beams L1 and L2 as received coincide with each other perfectly in the initial state, then the brightness of the interference light beam between the reflected light beams L1 and L2 becomes maximum, as can be seen in FIG. 3A.

On the other hand, the optical path length between the laser displacement meter 30 and the reflecting plate 32 remains always constant independent of time lapse. Accordingly, when the surface of the relatively thick portion 111 is displaced downwardly by a half of the wavelength of the laser beam due to the etching of the relatively thick portion 111, the phase of the reflected light beam L1 is shifted from that of the reflected light beam L2 by the half-wavelength, as is illustrated in FIG. 3B. As a result of this, the brightness or intensity of the interference light beam between the reflected light beams L1 and L2 becomes minimum or lowest, as can be seen from FIG. 3B. Furthermore, when the surface of the relatively thick portion 111 is displaced additionally for a distance corresponding to the half-wavelength of the laser beam, the phase of the reflected light beam L1 again coincides with that of the reflected light beam L2, with the result that the brightness of the interference light beam becomes maximum (see FIG. 3C).

In this manner, the interference light beam indicating the interference between the reflected light beams L1 and L2 assumes periodically bright and dark states alternately at the time interval corresponding to the half-wavelength of the laser beam.

At this juncture, it should however be mentioned that the surface of the relatively thick portion 111 is displaced continuously instead of moving stepwise on a half-wavelength basis. This means that the phase of the reflected light beam L1 becomes deviated gradually from that of the reflected light beam L2.

More specifically, assuming that the interference light beam between the reflected light beams L1 and L2 forms an outermost ring R1 shown in FIG. 4A in the initial state (see FIG. 3A), the outermost ring R1 becomes gradually dark as the surface of the relatively thick portion 111 is displaced in the course of etching, as illustrated in FIG. 4B. When the surface of the relatively thick portion 111 has been displaced by a distance corresponding to the half-wavelength of the laser beam, the outermost ring R1 becomes darkest, as illustrated in FIG. 4C, while an adjacent ring R2 becomes brightest. Upon further displacement of the surface of the relatively thick portion 111, the outermost ring R1 resumes brightness (see FIG. 4B). When the surface of the relatively thick portion 111 has been displaced for a distance corresponding to one wavelength, the outermost ring R1 becomes brightest again (see again FIG. 4A).

The laser displacement meter 30 incorporates a photoelectric transducer unit designed for converting the brightness of e.g. the outermost ring R1 mentioned above into a corresponding voltage signal, although such photoelectric transducer unit is omitted from illustration.

Figure 5:
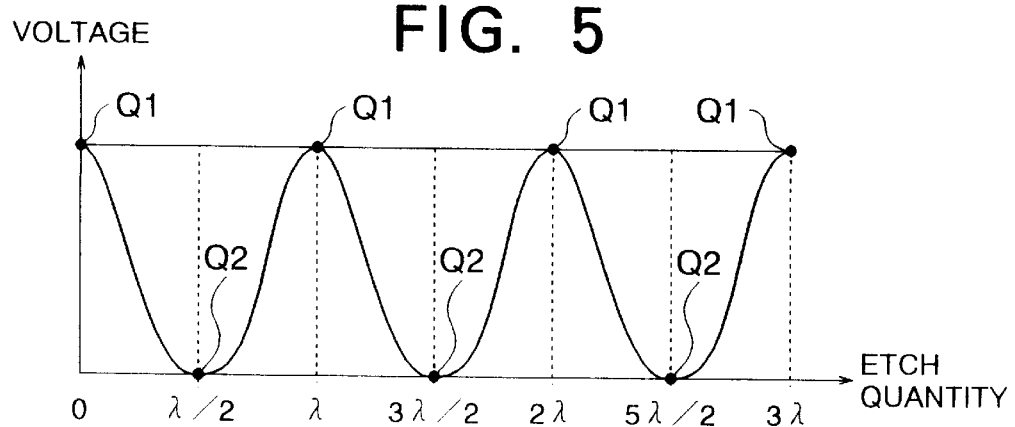
FIG. 5 is a waveform diagram of an output voltage of a photoelectric transducer unit.

FIG. 5 is a waveform diagram of the output voltage of the photoelectric transducer unit.

As mentioned hereinbefore, the brightness of the outermost ring R1 changes continuously during a period corresponding to the half-wavelength of the laser beam. As a consequence, the output voltage of the photoelectric transducer unit becomes lower during time periods from $2P\lambda/2$ to $(2P+1)\lambda/2$, respectively, while the output voltage rises up during periods from $(2P+1)\lambda/2$ to $(2P+2)\lambda/2$, respectively. Parenthetically, P represents an integer.

The laser displacement meter 30 is provided with a circuit (not shown) for detecting a maximum voltage value Q1 and a minimum voltage value Q2, respectively, and a counter 30a (see FIG. 2).

The counter 30a is adapted to count the pulses outputted from the above-mentioned circuit to output a signal indicating the count number or value m.

On the other hand, the X-Y driving mechanism 4 which is known in the art is so designed that it causes the casing 2a to be moved or displaced in X- and Y-directions (i.e., right and left directions as viewed in FIG. 1 and direction perpendicular to the plane of the figure) by means of a servo motor (not shown) for thereby positioning the conduit 20 of the plasma generator 2 at predetermined locations. Parenthetically, the X-Y driving mechanism 4 is under the control of the controller 5 as in the case of the measuring apparatus 3.

Figure 6:
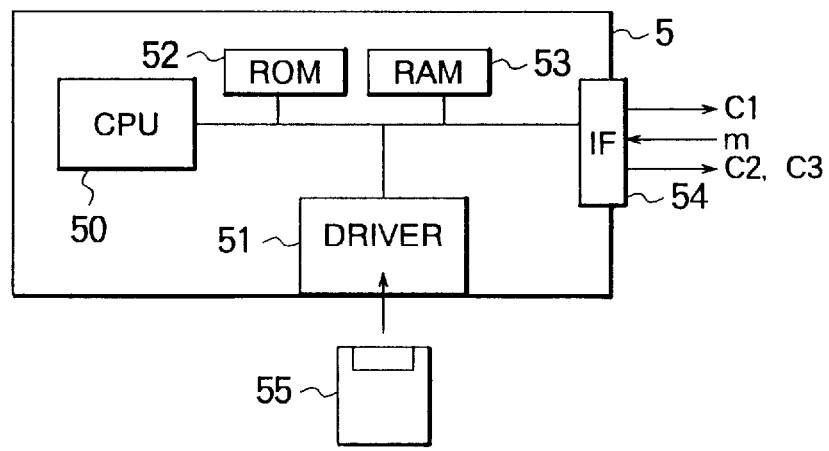
FIG. 6 is a block diagram showing a structure of a controller.

Now, referring to FIG. 6, the controller 5 comprises a CPU (central processing unit) 50 and a driver 51, a ROM (read-only memory) 52 and a RAM (random access memory) 53 which are connected to the CPU 50 by buses. Connected to the controller 5 by way of an interface 54 (labeled "IF" in FIG. 6) are the laser displacement meter 30 of the measuring apparatus 3 and the X-Y driving mechanism 4 (see FIG. 1).

The driver 51 is implemented as a driving unit for reproducing data recorded on a recording medium 55 such as a floppy disk, an optomagnetic disk or the like. In the recording medium 55 adapted to be driven by the driver 51, there are previously stored the data concerning the relatively thick portions 111 existing on the wafer 110.

Figure 7A:
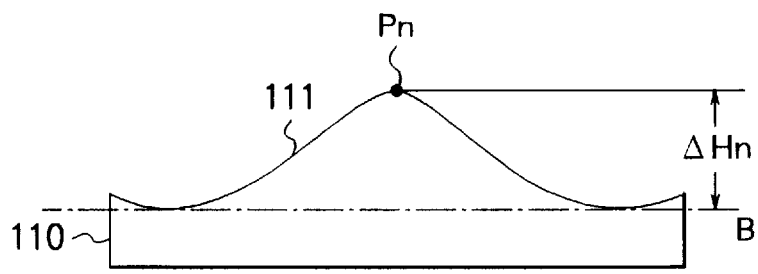
FIG. 7A is a view for illustrating data stored as records in a recording medium.
Figure 7B:
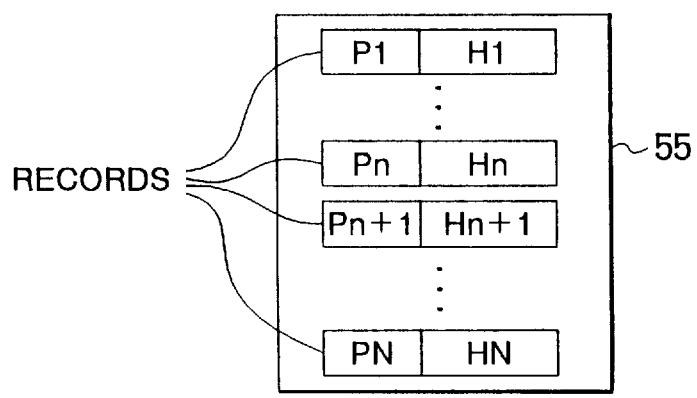
FIG. 7B is a schematic diagram for illustrating data concerning relatively thick portion in the state as stored in the recording medium.

FIG. 7B is a schematic diagram for illustrating data concerning the relatively thick portion 111 as stored in the recording medium 55.

In the case where relatively thick portions exist in a number N on the surface of the wafer 110, position data concerning the positions of the individual relatively thick portions 111 and integral value data corresponding to the heights of the relatively thick portions 111, respectively, are recorded on the recording medium 55.

More specifically, referring to FIG. 7B, for the n-th relatively thick portion 111 (where $n \leq N$), a combination of position data Pn indicating the position of the n-th relatively thick portion 111 on the X-Y coordinate system and integral value data Hn corresponding to a height $\Delta Hn$ of the relatively thick portion from a reference plane B (indicated by a single-dotted broken line in FIG. 7A) is stored as one record, and a number of those records corresponding to first to N-th relatively thick portions 111, respectively, are stored in the recording medium 55.

Parenthetically, the integral value data Hn is given as an integer value derived by dividing the height $\Delta Hn$ of the relatively thick portion 111 by the half-wavelength $\lambda/2$ of the laser beam of the laser displacement meter 30 shown in FIGS. 1 and 2. At this juncture, it should be mentioned that the height $\Delta Hn$ of the relatively thick portion 111 can not always be represented by an integral multiple of the half-wavelength $\lambda/2$ of the laser beam. Accordingly, in the plasma etching system according to the instant embodiment of the invention, an integer value closest to the quotient obtained by dividing the height $\Delta Hn$ of the relatively thick portion 111 by the half-wavelength $\lambda/2$ is recorded as the integral value data Hn.

The CPU 50 is so programmed as to control the laser displacement meter 30 of the measuring apparatus 3 and the X-Y driving mechanism 4 in accordance with the data read out from the recording medium 55 by way of the RAM 53 and the count value m output fed from of the laser displacement meter 30.

The program or programs executed by the CPU 50 is previously loaded in the ROM 52, and various controls involved in carrying out the plasma etching method are executed by the CPU 50 on the basis of these application programs.

Now, description will be made of the control functions or operations of the controller 5 in detail.

Figure 8:
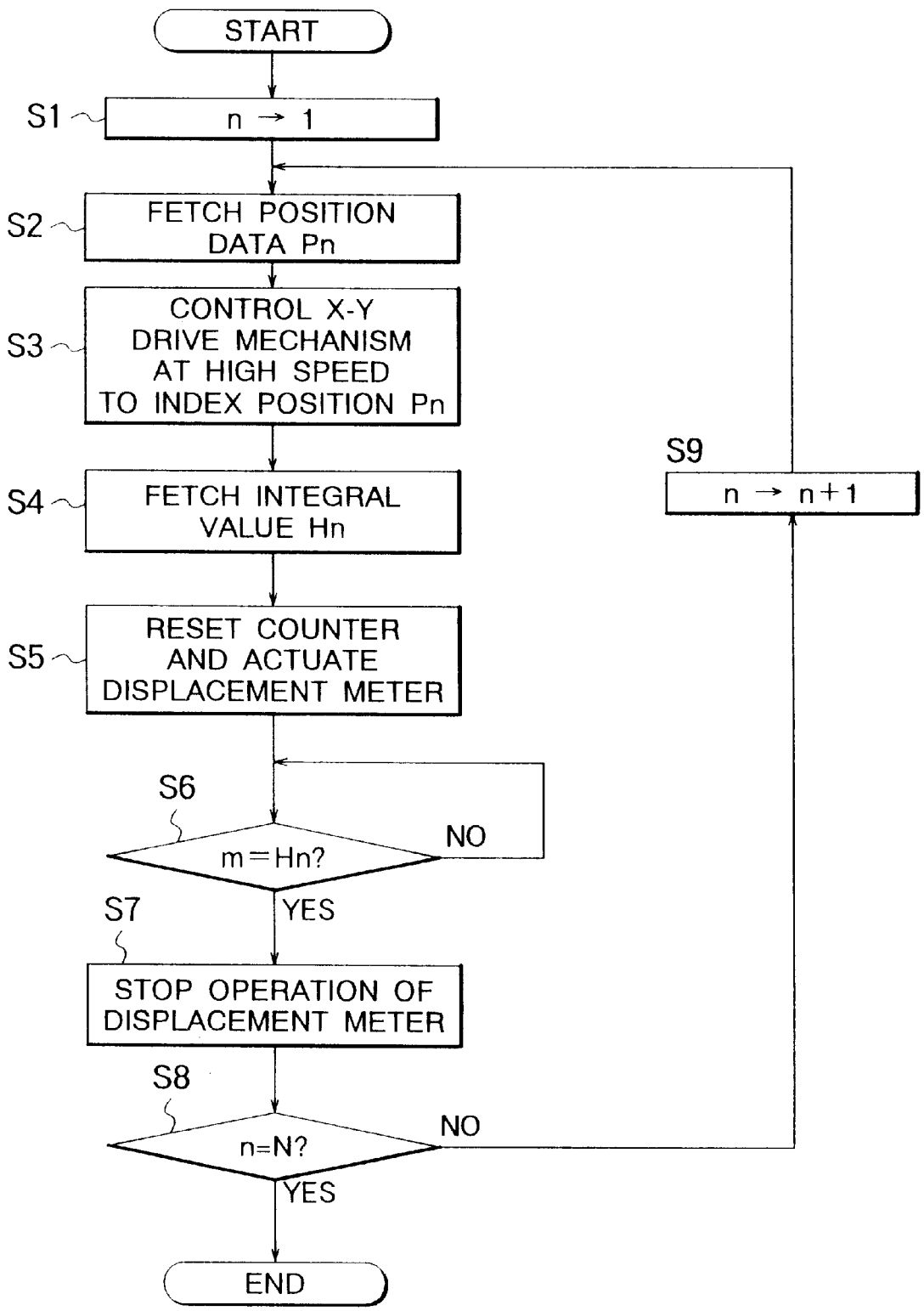
FIG. 8 is a flow chart for illustrating control functions of a controller.

FIG. 8 is a flow chart illustrating, by way of example, the control functions of the controller 5.

Referring to FIG. 8, the CPU 50 of the controller 5 fetches the position data Pn from the record concerning the n-th relatively thick portion 111 recorded on the recording medium 55 (step S1, step S2), to thereby output an X-Y control signal C1 for controlling the X-Y driving mechanism 4 at high speed so that the conduit 20 shown in FIG. 2 is positioned immediately above the n-th relatively thick portion 111 with the jet nozzle 20a being positioned in opposition to the relatively thick portion 111 (step S3).

Subsequently, the CPU 50 of the controller 5 reads out or fetches the integral value data Hn from the recording medium 55 (step S4) while resetting the counter 30a of the laser displacement meter 30 and outputs a displacement meter control signal C2 to the laser displacement meter 30 for actuating the same (step S5).

In succession, the counter value m read out from the counter 30a is compared with the integral value data Hn, whereon decision is made whether the above comparison results in coincidence or not (step S6).

Unless the counter value m as inputted does not yet coincide with the integral value data Hn, inputting of the counter value m and the comparison thereof with the integral value data Hn are continued (the case where the answer of the decision step S6 is negative "NO").

On the other hand, when coincidence is found between the counter value m and the integral value data Hn in the step S6, a displacement meter control signal C3 for stopping operation of the laser displacement meter 30 is outputted (step S7 activated when the output of the step S6 is affirmative "YES").

Thereafter, it is decided whether or not the relevant n-th relatively thick portion 111 is the final or last one (step S8). Unless the n-th relatively thick portion 111 is the last one (i.e., not the N-th relatively thick portion 111 on the aforementioned presumption), the position data Pn for the succeeding relatively thick portion 111 is fetched to control the X-Y driving mechanism 4 at high speed, whereon the processing similar to those described above is repeatedly executed (step S9, step S2 to step S8 following the output "NO" of the step S8). On the contrary, when the n-th relatively thick portion 111 is the last one (i.e., when n=N), then the processing described above is terminated (the case where the answer of the decision step S8 is "YES").

Now, description will turn to operation of the plasma etching system according to the instant embodiment of the present invention. Incidentally, operation of the plasma etching method described below virtually corresponds to the plasma etching method described hereinbefore in conjunction with the first general aspect of the invention and the first preferred mode for carrying out the invention.

Figure 9A:
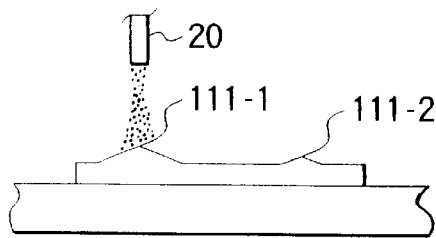
FIGS. 9A and 9B are schematic diagrams for illustrating operations of the plasma etching system.
Figure 9B:
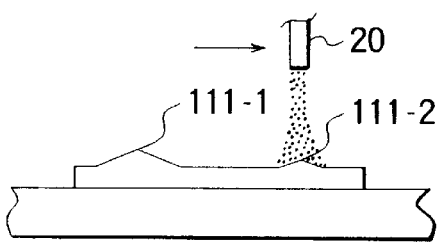

In the following description, it is assumed for facilitation of understanding that a wafer 110 having two discrete relatively thick portions 111-1 and 111-2 is subjected to the planarization process, as illustrated in FIGS. 9A and 9B.

It is further assumed that the positions and the heights of the relatively thick portions 111-1 and 111-2 of the wafer 110 are represented by combination data (P1, ΔH1) and (P2, ΔH2). See FIG. 7.

The height data ΔH1 and ΔH2 are translated into integral value data H1 and H2, respectively, by dividing the former by the half-wavelength λ/2 of the laser light emitted by the laser displacement meter 30 shown in FIG. 2, whereon the records (P1, H1) and (P2, H2) of the relatively thick portions 111-1 and 111-2, respectively, are recorded on the recording medium 55.

The recording medium 55 is then placed in the driver 51 of the controller 5 shown in FIG. 6. Subsequently, the plasma generator 2 and the controller 5 shown in FIG. 1 are put into operation. Thus, the fluorine gas G is ejected onto the surface of the wafer 110 from the jet nozzle 20a, while the position data P1 is fetched by the CPU 50 from the record concerning the relatively thick portion 111-1, as a result of which the X-Y control signal C1 is outputted to the X-Y driving mechanism 4 from the controller 5.

In response to the position data P1, the X-Y driving mechanism 4 displaces at high speed the casing 2a shown in FIG. 1 to thereby position the conduit 20 immediately above the relatively thick portion 111-1 shown in FIG. 9A.

At the same time, the integral value data H1 of the relatively thick portion 111-1 is read out from the recording medium 55 by the controller 5, whereby the displacement meter control signal C2 is inputted to the laser displacement meter 30 from the controller 5.

Due to the operation mentioned above, the counter 30a is reset with the laser displacement meter 30 being put into operation.

Upon actuation of the laser displacement meter 30, the laser beam L0 is emitted from the laser displacement meter 30, as illustrated in FIG. 2, whereby the reflected light beam L1 from the relatively thick portion 111-1 and the reflected light beam L2 from the reflecting plate 32 impinge on the laser displacement meter 30, as a result of which interference light beam between the reflected light beams L1 and L2 is received by the laser displacement meter 30.

In this initial state, when the reflected light beam L1 from the relatively thick portion 111-1 and the reflected light beam L2 coincide with each other in respect to the phase, as illustrated in FIG. 3A, a pulse representing a first maximum voltage value Q1 shown in FIG. 5 is inputted to the counter 30a, whereby the counter value m "1" is outputted from the counter 30a to the controller 5.

When the surface of the relatively thick portion 111-1 is etched or removed by an amount corresponding to the half-wavelength λ/2 under the action of the gas G as the etching proceeds for the relatively thick portion 111-1, a pulse indicating a first minimum voltage value Q2 is inputted to the counter 30a, whereby the counter value m of "2" is outputted from the counter 30a to the controller 5.

In this way, the counter value m outputted to the controller 5 is sequentially incremented as the etching for the relatively thick portion 111-1 proceeds.

On the other hand, in the controller 5, the integral value data H1 is compared with the counter values m furnished sequentially from the laser displacement meter 30. When coincidence is found between the counter value m and the integral value data H1, the displacement meter control signal C3 is outputted from the controller 5 to the laser displacement meter 30, whereby operation of the laser displacement meter 30 is stopped.

Now, the relatively thick portion 111-2 is in its turn to undergo the plasma etching process. Thus, the position data P2 of the relatively thick portion 111-2 is fetched. The conduit 20 is moved or displaced at high speed to the position immediately above the relatively thick portion 111-2, whereon the processing/treatment steps similar to those for the relatively thick portion 111-1 described above are carried out.

For the purpose of demonstration, wafers 110 of six inches were experimentally treated in the plasma etching system of the structure and arrangement described above. It has been confirmed that the total thickness value (indicating the global planarization) and the local thickness value can be improved from 0.5 µm to 0.13 µm on an average with dispersion being limited to 0.02 or less in terms of the standard deviation. Thus, it is safe to say that the plasma etching system according to the instant embodiment of the invention can realize satisfactorily the planarization of the wafer.

As is apparent from the foregoing description, because the plasma etching system according to the instant embodiment of the invention is so arranged that etching operation for the relatively thick portion of the wafer is performed while comparing the counter value m outputted from the laser displacement meter 30 with the integral value data Hn by the controller 5, i.e., monitoring the etch quantity or the amount or quantity of material as etched from the relatively thick portion 111, it is possible to reduce the relatively thick portion 111 by a desired height with high accuracy even when the density of the activated gas G should change due to variation in the environment of factors such as plasma parameters of the plasma generator 2. As a result of this, the wafers 110 of high quality can be manufactured without suffering any appreciable dispersion in the planarization among the products.

The plasma etching system according to the instant embodiment of the invention is implemented in such arrangement that the numbers of occurrence of the maximum voltage value Q1 and the minimum voltage value Q2, respectively, in the output of the photoelectric transducer unit are counted, and that when the counter value m coincides with the integral value data Hn, the relatively thick portion 111 has been etched away or removed by the amount or quantity corresponding to "integral value data Hn×half-wavelength λ/2". Accordingly, some error may take place.

More specifically, in the initial state in which the conduit 20 is positioned immediately above the relatively thick portion 111, the phase of the reflected light beam L1 coincides perfectly with that of the reflected light beam L2 or alternatively the former is deviated from the latter with a difference within the range of the half-wavelength λ/2. Consequently, in the latter case, the amount of the material actually etched from the relatively thick portion 111 is an amount given by an "integral value data Hn×half-wavelength λ/2" but short of the half-wavelength λ/2. This shortage makes appearance as an error.

In practical application, the wavelength λ of the laser beam emitted from the laser displacement meter 30 of the plasma etching system is significantly short on the order of 630 nm. Accordingly, the error corresponding to the half-wavelength λ/2 is 315 nm, which may be regarded as falling within the tolerance range.

In this conjunction, it can readily be understood that the error mentioned above can be minimized by using the laser beam having a short wavelength λ, which allows the etch process to be carried out with higher accuracy.

Embodiment 2

Second embodiment of the invention will be described. The plasma etching system according to the second embodiment differs from the system of the first embodiment in that the etch quantity can be continuously monitored.

Figure 10:
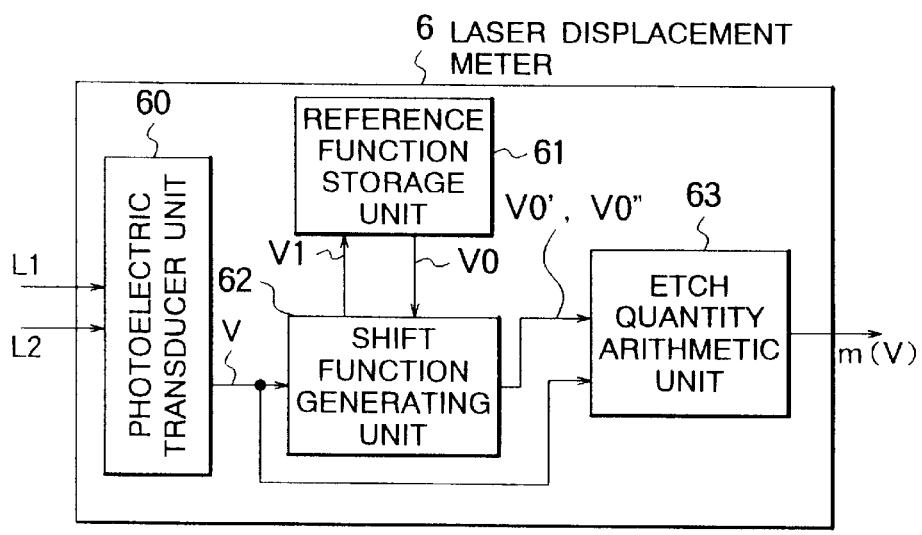
FIG. 10 is a block diagram showing schematically an arrangement of a laser displacement meter employed in the plasma etching system according to a second embodiment of the invention.
Figure 12A:
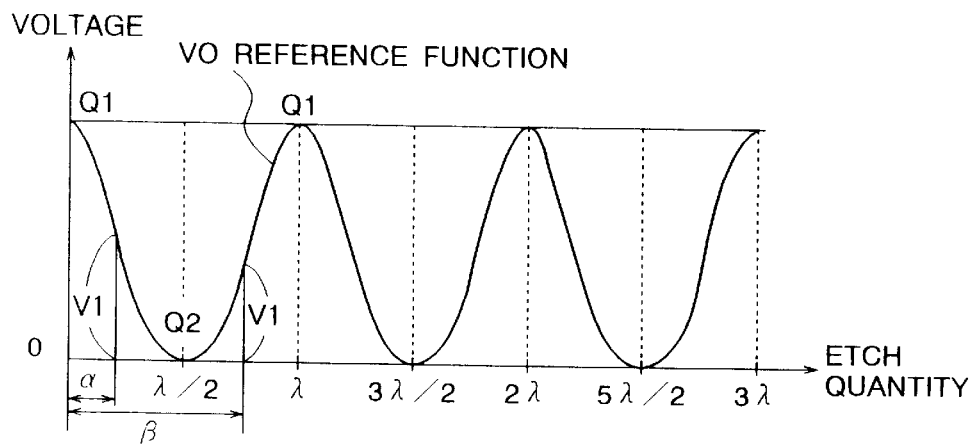
FIGS. 12A to 12C are waveform diagrams showing various functions used in the laser displacement meter shown in FIG. 10.
Figure 12B:
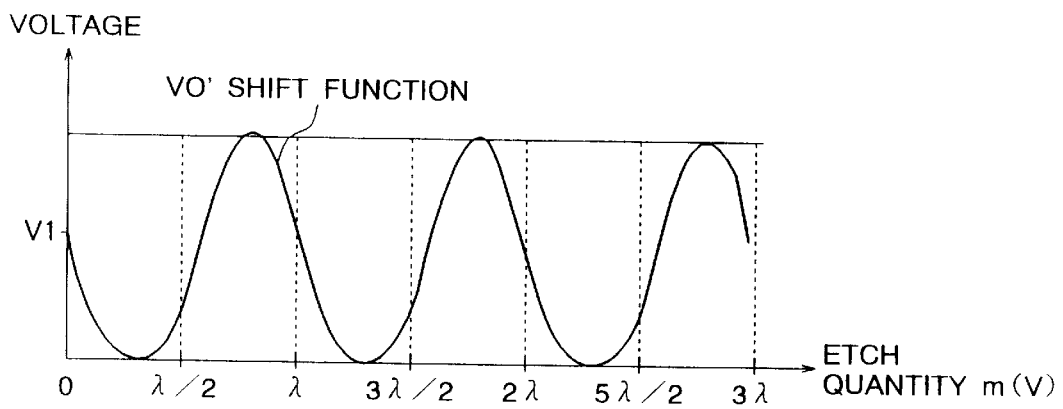
Figure 12C:
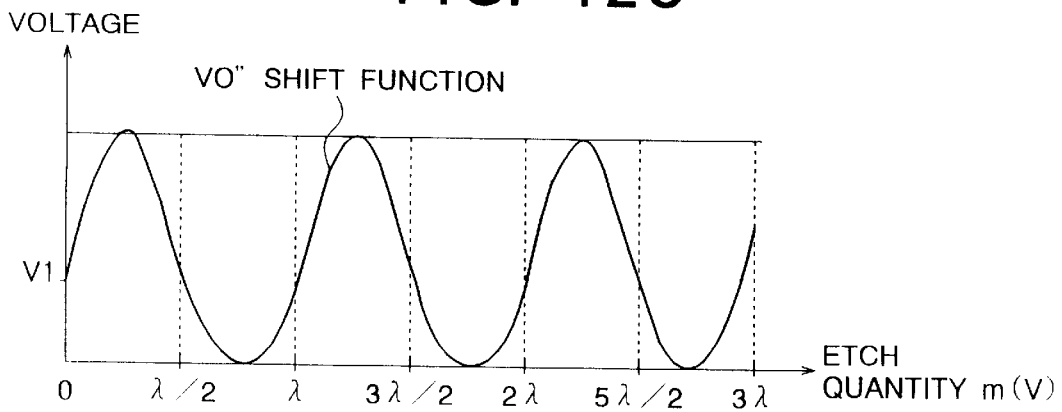

FIG. 10 is a block diagram showing schematically an arrangement of a laser displacement meter employed in the plasma etching system according to the second embodiment of the invention, and FIGS. 12A to 12C are waveform diagrams showing various functions used in the laser displacement meter shown in FIG. 10.

Referring to FIG. 10, the laser displacement meter 6 (second laser displacement meter) according to the instant embodiment of the invention comprises a photoelectric transducer unit 60, a reference function storage unit 61 and an etch quantity arithmetic unit 63.

The photoelectric transducer unit 60 is implemented essentially in a same structure as the photoelectric transducer unit employed in the laser displacement meter 30 according to the first embodiment of the invention and adapted to output a voltage V corresponding to brightness of interference fringes between the reflected light beams L1 and L2.

The reference function storage unit 61 serves to store a predetermined reference function V0 such as illustrated in FIG. 12A. More specifically, in the plasma etching system according to the instant embodiment of the invention, the reference function V0 represents a waveform simulating that of the voltage V which will be outputted from the photoelectric transducer unit 60 upon coincidence between the reflected light beams L1 and L2, as shown in FIG. 3A.

The shift function generating unit 62 is so designed as to generate shift functions V0' and V0" such as illustrated in FIGS. 12B and 12C, respectively, on the basis of the reference function V0 stored in the reference function storage unit 61.

More specifically, the voltage V outputted from the photoelectric transducer unit 60 is fetched as an initial voltage value V1 (initial value) to be stored in the reference function storage unit 61, whereupon inputting of the maximum voltage value Q1 or the minimum voltage value Q2 is waited for. When the minimum voltage value Q2 is first inputted, the reference function V0 and the initial voltage value V1 are read out from the reference function storage unit 61 to determine a value α corresponding to the initial voltage value V1 existing in precedence to the minimum voltage value Q2 during an interval from zero to λ/2 of the reference function V0 shown in FIG. 12A. Subsequently, the reference function V0 is shifted to the left by the value α to thereby generate the shift function V0' shown in FIG. 12B which represents a relation between the voltage V and the etch quantity expected after the input of the initial voltage value V1.

On the other hand, when the maximum voltage value Q1 is inputted, a value β corresponding to the initial voltage value V1 existing in precedence to the maximum voltage value Q1 during the above-mentioned interval of the reference function V0 is determined, whereby the reference function V0 is shifted to the left by the value β to thereby generate the shift function V0" as shown in FIG. 12C.

The etch quantity arithmetic unit 63 serves to arithmetically determine an actual etch quantity m(v) of the relatively thick portion 111 on the basis of the shift function V0' or V0" outputted from the shift function generating unit 62 and the voltage V outputted from the photoelectric transducer 60. The etch quantity outputted from the arithmetic unit 63 is supplied to the controller 5.

In more concrete, in the status in which the shift function V0' is inputted to the etch quantity arithmetic unit 63 from the shift function generating unit 62, the voltage V corresponding to the shift function V0' is inputted gradually. In other words, the values of the voltage V following the curve of the shift function V0' to the right, as viewed in FIG. 12, starting from the initial voltage value V1, are inputted to the etch quantity arithmetic unit 63. Accordingly, by assigning a value of the voltage V inputted at a given time point to the shift function V0', the corresponding actual etch quantity m(v) at that given time point can be arithmetically determined. The etch quantity arithmetic unit 63 outputs the actual etch quantity m(v) determined in this way to the of the controller 5. Similar arithmetic processing is executed upon inputting of the shift function V0" to the etch quantity arithmetic unit 63 from the shift function generating unit 62.

In this manner, the actual etch quantity m(v) which increases as the etching of the relatively thick portion 111 progresses and which indicates an actual decrease in the thickness of the relatively thick portion 111 is supplied to the controller 5.

The controller 5 compares the actual etch quantity m(v) inputted from the laser displacement meter 6 with predetermined data recorded on the recording medium to thereby stop the operation of the laser displacement meter 6 when coincidence is resulted from the above comparison. Namely, the controller 5 serves for the substantially same function as that employed in the plasma etching system according to the first embodiment of the invention.

Figure 11:
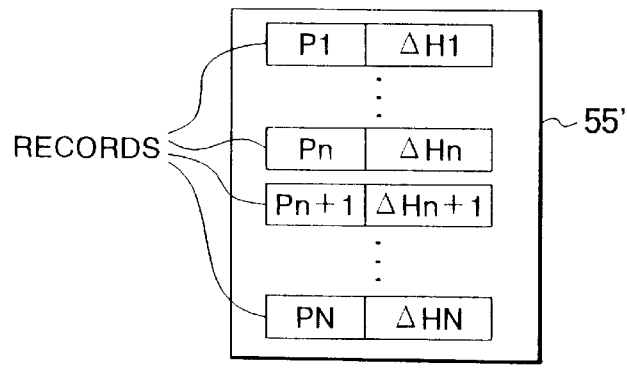
FIG. 11 is a schematic diagram illustrating records stored in a recording medium.

FIG. 11 is a schematic diagram for illustrating record stored on the recording medium.

As can be seen in FIG. 11, the recording medium 55' stores therein records each representing a combination of position data Pn and a relatively thick portion 111 and height data ΔHn indicating an actual height of the relatively thick portion 111 in a number corresponding to that of the relatively thick portions 111 existing on a wafer.

The CPU 50 of the controller 5 reads out the height data ΔHn at the position Pn from the recording medium 55' to thereby compare the height data ΔHn with the actual etch quantity m(v) and outputs the displacement meter control signal C3 to the laser displacement meter 6 when coincidence is detected between the height data ΔHn and the actual etch quantity m(v).

Now, description will be directed to the operation of the major portion of the plasma etching system according to the instant embodiment of the invention. Parenthetically, the operations described below can be realized by resorting to the plasma etching method described hereinbefore in conjunction with the first general aspect of the invention and the third preferred mode for carrying out the same.

Figure 13:
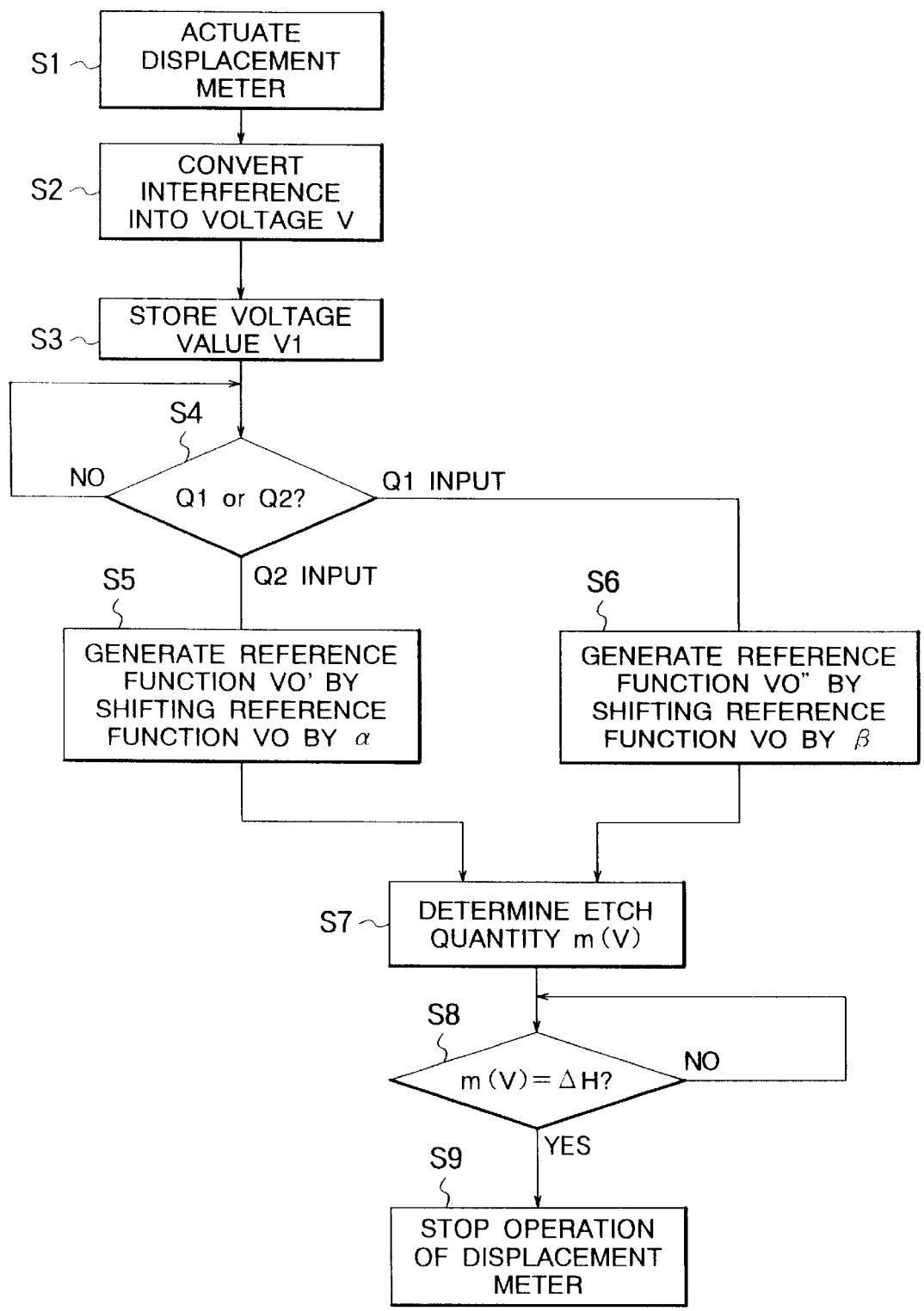
FIG. 13 is a flow chart for illustrating operation of the laser displacement meter.

FIG. 13 is a flow chart illustrating, by way of example, operation of the controller 5.

Referring to the flow chart, the CPU 50 of the controller 5 (see FIG. 6) fetches the position data Pn from the record concerning an n-th relatively thick portion 111 stored in the recording medium 55', to thereby output an X-Y control signal C1 for controlling the X-Y driving mechanism 4 so that the conduit 20 is positioned immediately above the n-th relatively thick portion 111.

Subsequently, the CPU 50 of the controller 5 reads out the height data ΔHn from the recording medium 55' to output a displacement meter control signal C2 to the laser displacement meter 6 for actuating the same.

Thus, the laser displacement meter 6 is put into operation (step S1 in FIG. 13), whereby the surface of the relatively thick portion 111 is irradiated with the laser beam (step S1).

When the interference light beam resulting from interference between the reflected light beams L1 and L2 impinges on the photoelectric transducer unit 60 of the laser displacement meter 6, the voltage V corresponding to the brightness or intensity of the interference fringes is outputted to the shift function generating unit 62 and the etch quantity arithmetic unit 63 (step S2).

Thus, in the shift function generating unit 62, the initial voltage value V1 of the voltage V as inputted is stored in the reference function storage unit 61. Thereafter, it is decided whether the maximum voltage value Q1 or the minimum voltage value Q2 has been inputted (steps S3 and 4).

When the minimum voltage value Q2 is inputted first, the shift quantity α is determined on the basis of the reference function V0 stored in the reference function storage unit 61 and the initial voltage value V1, whereon the reference function V0' is generated by shifting the reference function V0 by α (see FIGS. 12A and 12B). On the other hand, when the maximum voltage value Q1 is inputted first, the shift quantity β is determined to thereby generate the reference function V0" (see FIG. 12C) in steps S4 and S5 or S6).

In this way, either the shift function V0' or the shift function V0" is inputted to the etch quantity arithmetic unit 63 from the shift function generating unit 62 together with the voltage V from the photoelectric transducer unit 60. Thus, the etch quantity arithmetic unit 63 arithmetically determines the actual etch quantity m(v) indicating the decrease in thickness of the relatively thick portion 111 at the current time point. The actual etch quantity m(v) is outputted to the controller 5 (step S7).

In the controller 5, the CPU 50 then makes decision whether the height data ΔHn fetched in advance and the actual etch quantity m(v) as inputted coincide with each other. When coincidence is found, then the displacement meter control signal C2 is outputted from the controller 5 to the laser displacement meter 6, operation of which is then stopped (steps S8 and 9).

With the arrangement of the plasma etching system according to the instant embodiment of the invention, the etching process for the relatively thick portion 111 is carried out while comparing the actual etch quantity m(v) outputted continuously from the laser displacement meter 6 with the height data ΔHn. Thus, the etching can be realized perfectly in conformance with the height data ΔHn, whereby extremely high accuracy can be ensured for the etching.

In other respects concerning the structures and the operation, the plasma etching system according to the instant embodiment of the invention is essentially same as that of the first embodiment of the invention. Accordingly, repeated description thereof will be unnecessary.

Embodiment 3

A third embodiment of the invention will be described by reference to FIG. 14 which is a block diagram showing a major portion of a plasma etching system according to the third embodiment.

Figure 14:
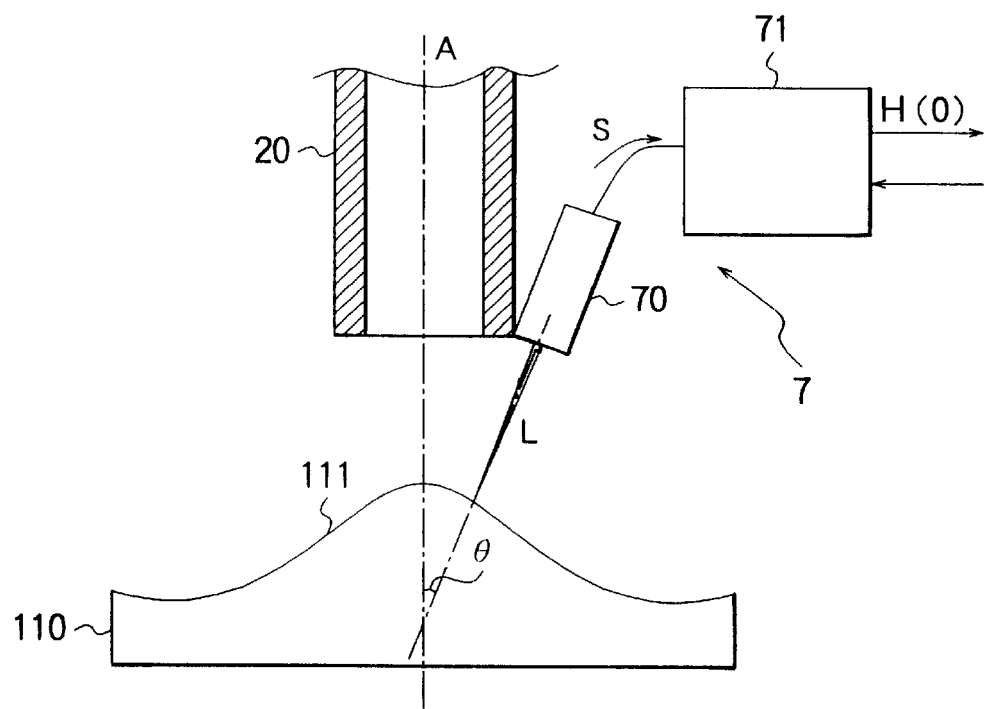
FIG. 14 is a block diagram showing a major portion of a plasma etching system according to a third embodiment of the invention.

As can be seen in FIG. 14, the plasma etching system now under consideration comprises a measuring apparatus 7 which comprises a laser displacement meter 70 and an arithmetic unit 71.

The laser displacement meter 70 is so designed as to be capable of measuring a distance to the surface of a relatively thick portion 111 on a wafer 110. To this end, the laser displacement meter 70 is mounted at a position in the vicinity of the conduit 20.

More specifically, the laser displacement meter 70 is mounted with an angle θ of inclination relative to the center axis A of the conduit 20. Thus, the measuring apparatus 7 irradiates an inclined or slant surface of the relatively thick portion 111 with the laser beam L for thereby measuring the distance to the slant surface to output a signal S indicating the distance, which signal is supplied to the arithmetic unit 71.

The arithmetic unit 71 in turn determines arithmetically the etch quantity of the relatively thick portion 111 on the basis of the signal S supplied from the laser displacement meter 70.

Figure 15:
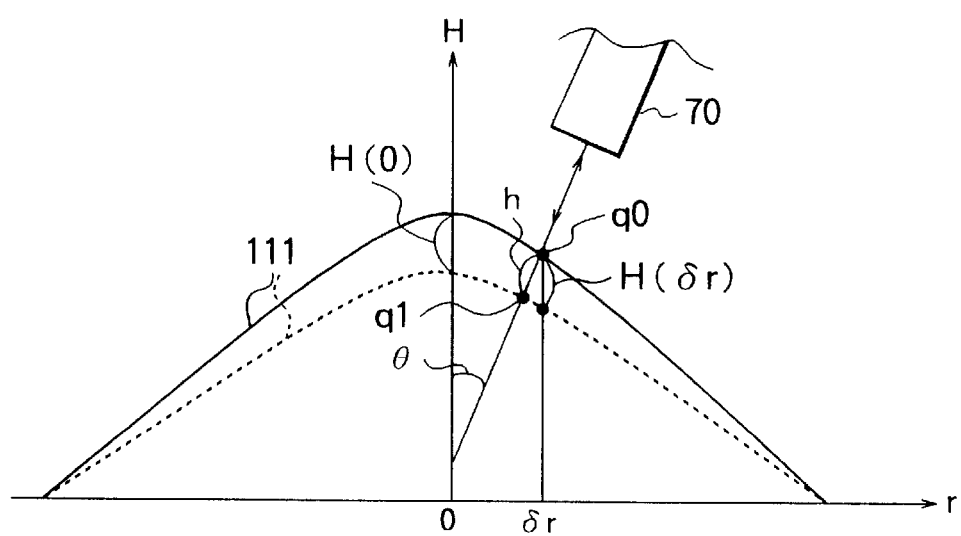
FIG. 15 is a schematic diagram of a relatively thick portion illustrating an etch quantity at a measuring position and an etch quantity at an apex portion.

FIG. 15 is a schematic diagram for illustrating etch quantity at a distance measuring position and etch quantity at the apex of the relatively thick portion.

Referring to FIG. 15, it is assumed that the relatively thick portion 111 is etched to a level indicated by a broken-line curve in FIG. 5 from the initial state indicated by a solid-line curve. In that case, the location irradiated with the laser beam L emitted from the laser displacement meter 70 has changed from a point q0 to a point q1. Accordingly, the arithmetic unit 71 is so designed as to determine the distance between the points or locations q0 and q1 on the basis of the signal S supplied from the laser displacement meter 70.

In that case, assuming again that the point q0 is located at the position distanced from the center axis A by δr, the etch quantity H(δr) at that position can be given by the following expression (1):

$$H(\delta r) = h/\cos\theta \quad (1)$$

Subsequently, the etch quantity H(0) at the apex of the relatively thick portion 111 is arithmetically determined on the basis of the above-mentioned etch quantity H(δr)

In this conjunction, it can be appreciated from FIG. 15 that after lapse of a given etching period, the etch quantity H(0) at the apex portion of the relatively thick portion 111 is maximum and that the etch quantity decreases as the etched location becomes closer to the foot of the relatively thick portion 111.

Figure 16:
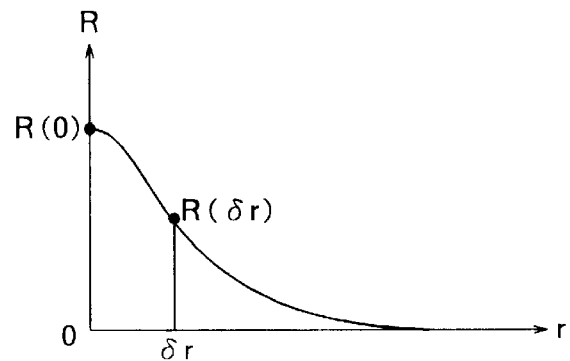
FIG. 16 is a view illustrating an etching profile referenced in arithmetic determination of etch quantity.

FIG. 16 is a view for illustrating an etching profile in conformance with which the arithmetic unit 71 determines the etch quantities H(0) and H(δr). To this end, a flat wafer 110 is etched during a predetermined time period to obtain in advance as an etching rate profile such as shown in FIG. 16 the relation between an etch quantity R(0) at the center of the wafer portion as etched and etch quantities in peripheral locations around the center.

The etching profile shown in FIG. 16 corresponds to a simplified or reduced-scale replica for the relation shown in FIG. 15. Accordingly, the etch quantity H(0) at the apex of the relatively thick portion 111 shown in FIG. 15 corresponds to the etch quantity R(0) in the etching profile diagram shown in FIG. 16, while the etch quantity H(δr) at the location irradiated with the laser beam L and distanced from the apex of the relatively thick portion 111 by the distance δr in FIG. 15 corresponds to the etch quantity R(δr) shown in FIG. 16. Accordingly, the following expression (2) applies valid:

$$H(0)/H(\delta r)=R(0)/R(\delta r) \qquad (2)$$

From the expressions (1) and (2), the following expression (3) can be deduced:

$$H(0)=R(0)\cdot h/R(\delta r)\cdot \cos\theta \qquad (3)$$

R(0) represents a constant, R(δr) represents a position irradiated with the laser beam L and θ represents an angle at which the laser beam L impinges onto the surface of the relatively thick portion 111 relative to the center axis perpendicular to the general plane of the wafer. Since these parameters have been determined previously, the variable in the above-mentioned expression (3) is only the displacement h of the position or location irradiated with the laser beam L.

Thus, the arithmetic unit 71 can arithmetically determine the displacement h on the basis of the signal S supplied from the laser displacement meter 70 and then the etch quantity H(0) at the apex of the relatively thick portion 111 on the basis of the displacement h in accordance with the above-mentioned expression (3), to thereby output the etch quantity H(0).

In the plasma etching system according to the third embodiment of the invention, the recording medium 55' employed in the system according to the second embodiment is used, wherein the controller 5 stops operation of the measuring apparatus 7 when coincidence is detected between the etch quantity H(0) outputted from the arithmetic unit 71 and the height data ΔHn read out from the recording medium 55' upon comparison thereof.

In other respects concerning the structures and the operation, the plasma etching system according to the instant embodiment of the invention is essentially same as those of the first and second embodiments of the invention. Accordingly, repeated description thereof will be unnecessary.

Embodiment 4

Description will next be made of a plasma etching system according to a fourth embodiment of the invention by reference to FIG. 17 which shows in a block diagram an arrangement of a major portion of the plasma etching system according to the fourth embodiment.

Figure 17:
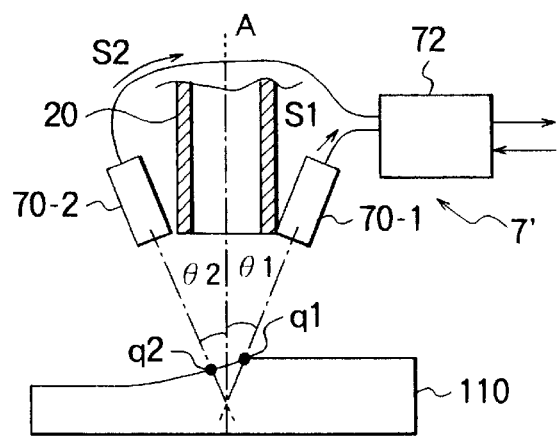
FIG. 17 is a block diagram showing a major portion of a plasma etching system according to a fourth embodiment of the invention.

As is shown in FIG. 17, the plasma etching system according to the instant embodiment of the invention includes a measuring apparatus 7' which comprises two laser displacement meters 70-1 and 70-2.

In the plasma etching system now under consideration, distances to locations q1 and q2 on a wafer 110 are measured by means of the laser displacement meters 70-1 and 70-2 disposed at inclination angles θ1 and θ2, respectively, whereby signals S1 and S2 indicating the distances mentioned above, respectively, are outputted to an arithmetic unit 72.

The arithmetic unit 72 is so designed as to determine the etch quantities at the locations q1 and q2 on the basis of the signals S1 and S2, respectively, and output to the controller 5 a mean value of these etch quantities as an etch quantity at the location around the center axis A of the conduit 20.

In other respects concerning the structures and the operation, the plasma etching system according to the instant embodiment of the invention is essentially same as those of the first to third embodiments of the invention. Accordingly, repeated description thereof will be unnecessary.

Many features and advantages of the present invention are apparent from the detailed description and thus it is intended by the appended claims to cover all such features and advantages of the system which fall within the true spirit and scope of the invention. Further, since numerous modifications and combinations will readily occur to those skilled in the art, it is not intended to limit the invention to the exact construction and operation illustrated and described.

By way of example, in the foregoing description, the plasma etching system has been assumed to be arranged such that the fluorine gas G is constantly or continuously ejected from the conduit 20 during the operation of the plasma etching system. However, such arrangement may equally be adopted that the jet of the fluorine gas G is interrupted when the etching process is changed over from one to another relatively thick portion.

Although it has been described that the conduit 20 is formed of quartz, it may be formed of ceramics such as silicon nitride or the like.

Furthermore, although it has been described that the plasma generating means is constituted by the plasma generator 2 which is so designed as to irradiate the plasma generating region within the conduit 20 with the microwave of a predetermined power to thereby generate the plasma containing the fluorine gas G, one of the activated species gas, it should be appreciated that an inductively coupled plasma generator (ICP) using a high frequency, a capacitive-coupled plasma generator, a plasma generator using a helicon wave, ECR (electron cyclotron resonance) or the like may be used as the plasma generating means constituting a part of the present invention.

Further, although it has been described that a gas mixture of $CF_4$, $O_2$ and Ar is used, it goes without saying that a gas of fluorocarbon series such as $SF_6$ may be used.

In conjunction with the plasma etching system according to the second embodiment of the invention, it has been described that the function the initial value of which is the maximum voltage value Q1 is adopted as the reference function. However, the invention is never restricted thereto. The invention may equally be carried out by using as the reference function the function the initial value of which is set at the minimum voltage value Q2 by shifting the phase of the function by half-wavelength λ/2 as illustrated in FIG. 12B.

Figure 18A:
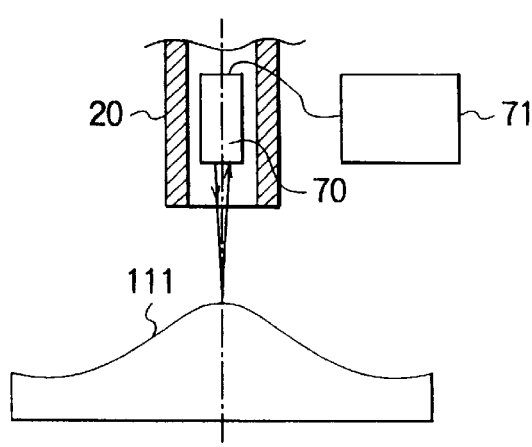
FIG. 18A is a schematic diagram showing a modification of the invention.
Figure 18B:
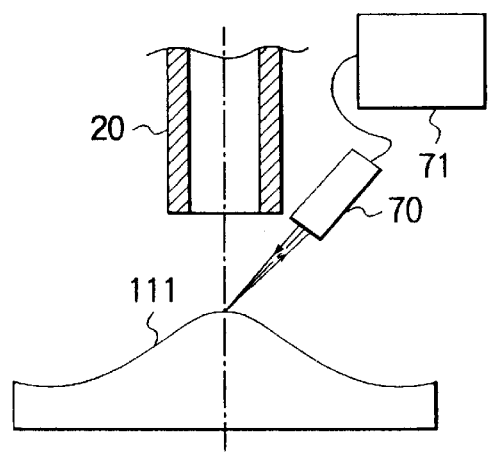
FIG. 18B is a view similar to FIG. 18 and shows another modification of the invention.

Furthermore, in the plasma etching system according to the third embodiment of the invention, the laser displacement meter 70 is disposed with inclination for measuring the etch quantity at a predetermined position on the inclined or slant surface of the relatively thick portion 111. However, the invention is never limited to such arrangement but other arrangements may be resorted to. By way of example, the laser displacement meter 70 may be disposed within the conduit 20 for measuring straightforwardly the etch quantity at the apex of the relatively thick portion 111 as shown in FIG. 18A or alternatively, the laser displacement meter 70 may be positioned with such inclination that the etch quantity at the apex of the relatively thick portion 111 is measured, as is shown in FIG. 18B.

Although it has been assumed in the description of the preferred embodiments that the invention is applied to remove by etching the relatively thick portion 111 of a convex shape in general, it goes without saying that the principle underlying the invention can equally find application to the etching process for the relatively thick portion generally of a concave shape having a thickness greater than a reference thickness. Of course, the plasma etching method according to the invention can be used for the etch process not only for a wafer but also glass sheet.

Figure 19:
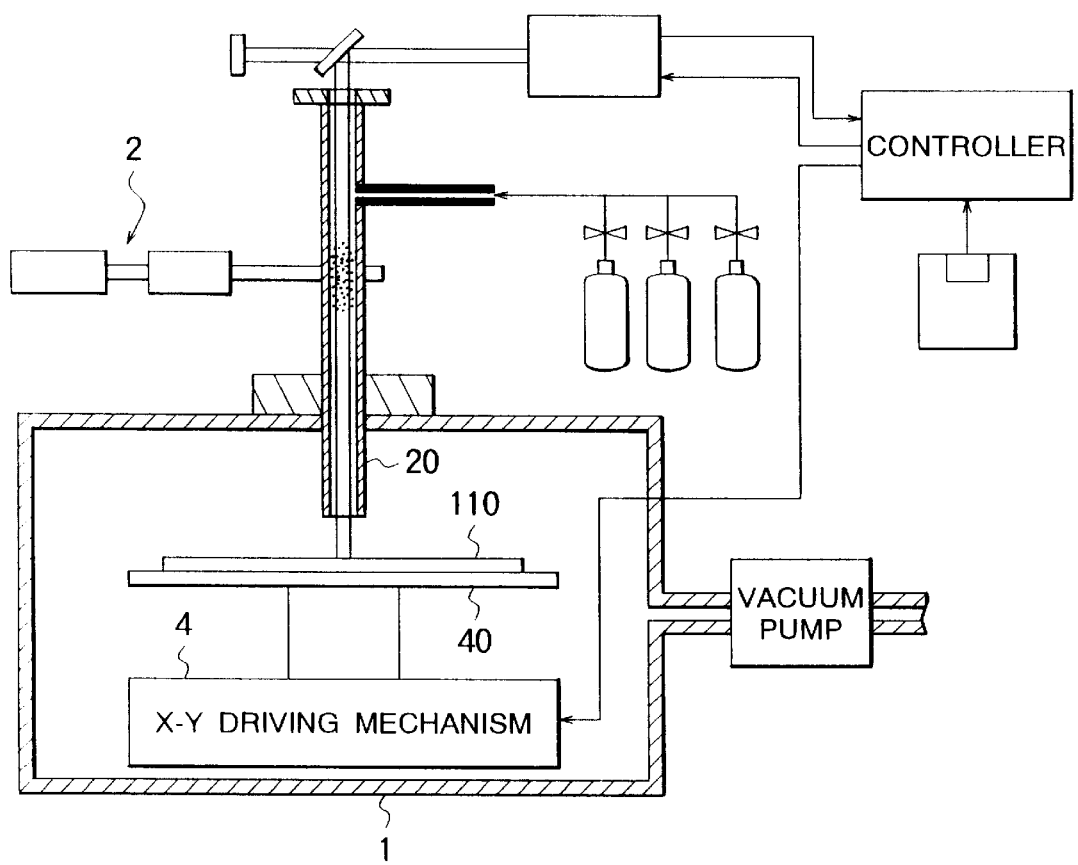
FIG. 19 is a schematic illustration of a plasma etching system in accordance with an alternate embodiment of the present invention.
Figure 20:
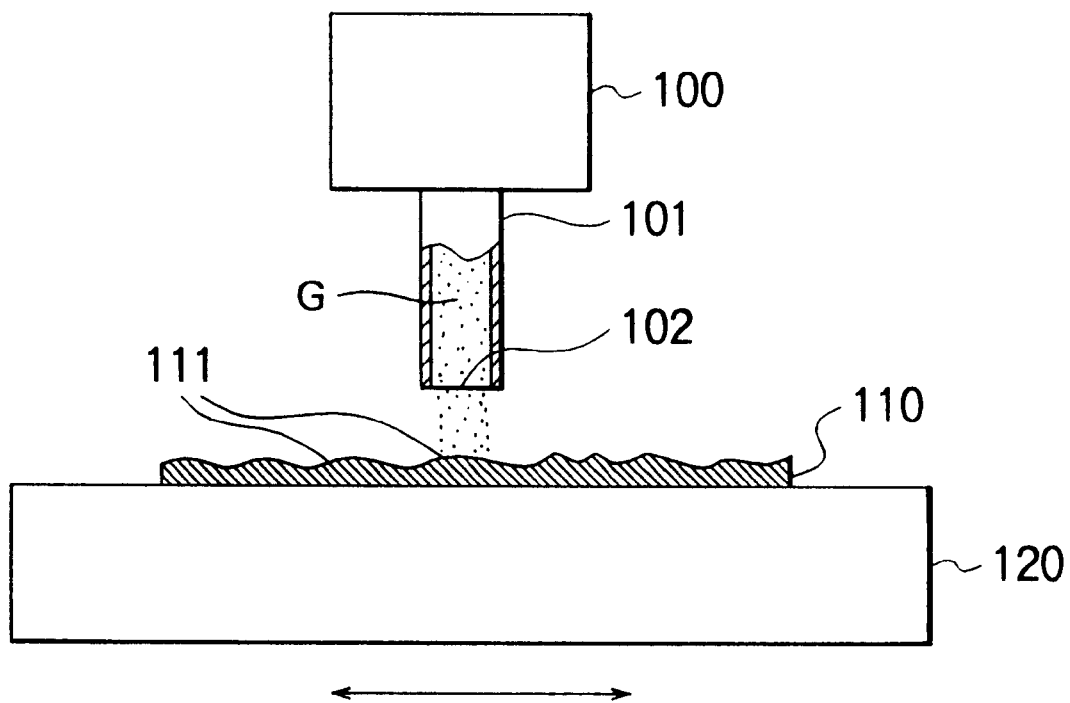
FIG. 20 is a schematic diagram showing a general arrangement of a conventional plasma etching system known heretofore.

Moreover, although it has been described in conjunction with the preferred or exemplary embodiment of the invention that the conduit 20 is positioned above the relatively thick portion 111 of concern by moving the plasma generator 2 with the aid of the X-Y driving mechanism 4. However, such an arrangement as shown in FIG. 19 may equally be adopted. More specifically, the plasma generator 2 may be mounted externally of the etching chamber 1 with the conduit 20 being fixedly secured to the etching chamber 1, wherein the stage 40 is moved by means of the X-Y driving mechanism 4 for thereby positioning a concerned relatively thick portion 111 of a wafer 110 immediately beneath the conduit 20.

As will now be appreciated from the foregoing description, because the plasma etching system according to the invention is so implemented that the etching can be carried out while measuring actually the etch quantity, i.e., the amount of material as removed by etching from relatively thick portion of concern, a desired amount of material can be removed from the relatively thick portion by etching even when the environmental factors such as the plasma parameters should vary. Thus, the invention can ensure excellently advantageous effect that planarization of articles subjected to the etching process can be realized with high quality and enhanced reliability without suffering any appreciable dispersions in the finished quality among the articles undergone the etching process.

Among others, in the plasma etching systems in which the shift function representing an expected relation between the electric signal and the etch quantity is generated on the basis of the initial value of the electric signal corresponding to the interference light and the value of the electric signal resulting from the photoelectric conversion is assigned to the shift function to thereby measure the actual etch quantity in the relatively thick portion, there can be realized the etch process ensuring very high precision, to another advantage.

Accordingly, all suitable modifications and equivalents may be resorted to, falling within the spirit and scope of the invention.

What is claimed is:

1. A plasma etching method of removing a relatively thick portion from a surface of an article of concern to realize flatness thereof through an etching process by ejecting a gas of activated species onto to said relatively thick portion from a jet nozzle of a plasma generating means disposed substantially in opposition to said relatively thick portion, said method comprising:
    measuring an actual etched quantity of said relatively thick portion by using a laser light beam; and
    terminating the etching process for said relatively thick portion when said actual etch quantity has attained a desired value.

2. A plasma etching method according to claim 1, wherein said measuring step includes the step of:
    setting previously an integral value obtained by dividing an etch quantity desired for substantially flattening said surface of said article by removing said relatively thick portion by a half wavelength of said laser light;
    irradiating a reflecting surface and a surface of said relatively thick portion, respectively, with said laser light beam; and
    measuring a number of times an interference state between a reflected light beam from said reflecting surface and a reflected light beam from said surface of said relatively thick portion changes periodically in dependence on the etch quantity of said relatively thick portion; and wherein said terminating step includes the step of:
    terminating the etching process for said relatively thick portion when said number of times said interference state has changed coincides with said integral value.

3. A plasma etching method according to claim 1, wherein said first step includes the steps of:
    setting previously an etched quantity desired for substantially flattening said surface of said article by removing said relatively thick portion through the etching process;
    irradiating a reflecting surface and a surface of said relatively thick portion, respectively, with the laser light beam and converting an interference light beam produced by interference between a reflected light beam from said reflecting surface and a reflected light beam from the surface of said relatively thick portion into a corresponding electric signal;
    setting a reference function representing a relation between said electric signal and said etch quantity and generating a shift function representing a predicted relation between said electric signal and the etch quantity by shifting said reference function on the basis of an initial value of said electric signal upon etching of said relatively thick portion and assigning values of said electric signal sequentially to said shift function; and wherein said second step includes the step of:
    terminating the etching process for said relatively thick portion when said actual etch quantity and said desired etch quantity substantially coincide with each other.

4. A plasma etching system, comprising:
    plasma generating means including a jet nozzle for ejecting a gas of activated species produced through excitation to a plasma state onto a relatively thick portion of an article of concern;
    measuring means for measuring an actual etch quantity of said relatively thick portion by using a laser light beam; and
    control means for comparing said actual etch quantity as measured by said measuring means with a set value and terminating the etching process for said relatively thick portion when said actual etch quantity coincides with said set value.

5. A plasma etching system according to claim 4,
    wherein said measuring means includes a laser light beam, having a wavelength, projected onto a reflecting surface and a surface of said relatively thick portion, respectively, said measuring means being configured to receive a reflected light beam from said reflecting surface and a reflected light beam reflected from the surface of said relatively thick portion and being further configured to detect a number of times an interference state between both the reflected light beams changes periodically in correspondence to said actual etch quantity of said relatively thick portion; and
    wherein said control means is configured to terminate said etching process when an integral value obtained by dividing an etch quantity desired for substantially flattening the surface of said article by removing said relatively thick portion by half a wavelength of said laser light beam coincides with said number of times the interference state has periodically changed.

6. A plasma etching system according to claim 5, wherein said measuring means comprises:
- a first laser displacement meter for sending and receiving said laser light beams, wherein said first laser displacement is configured to measure the number of times said interference state between said received laser light beams changes periodically;
- a half mirror interposed between said first laser-displacement meter and said jet nozzle of said plasma generating means for directing said laser light beam onto said relatively thick portion by way of said jet nozzle, said half mirror being configured to direct the reflected light beam from said relatively thick portion to said first laser displacement meter by way of said jet nozzle; and
- a reflecting plate disposed in opposition to said first laser displacement meter with said half mirror being interposed between said reflecting plate and said first laser displacement meter.

7. A plasma etching system according to claim 6, further comprising:
- displacing means for moving one of said article of concern and said jet nozzle relative to the other;
- wherein said control means includes:
  - a recording medium for storing data concerning said integral values corresponding to individual relatively thick portions and positions thereof; and
  - a controller for reading the position data and positioning said jet nozzle in opposition to the relatively thick portion located at the position corresponding to said position data and put into operation said measuring means, whereupon said controller compares said integral value with said number of times outputted from said measuring means and stops said measuring means when said comparison results in coincidence.

8. A plasma etching system according to claim 5, further comprising:
- displacing means for moving one of said article of concern and said jet nozzle relative to the other;
- wherein said control means includes:
  - a recording medium for storing data concerning said integral values corresponding to individual relatively thick portions and positions thereof; and
  - a controller for reading the position data and positioning said jet nozzle in opposition to the relatively thick portion located at the position corresponding to said position data and put into operation said measuring means, whereupon said controller compares said integral value with said number of times the interference state has changed as outputted from said measuring means and stops operation of said measuring means when said comparison results in coincidence.

9. A plasma etching system according to claim 4, wherein said measuring means includes a laser light beam, having a wavelength, projected onto a reflecting surface and the surface of said relatively thick portion, said measuring means being configured to convert an interference light resulting from interference between a reflected light beam from said reflecting surface and a reflected light beam from the surface of said relatively thick portion into a corresponding electric signal, and generate a shift function representing an expected relation between said electric signal and said etch quantity by shifting by a quantity a reference function representing a present relation between said electric signal and the etch quantity on the basis of an initial value of said electric signal in the etching process, wherein said actual etch quantity is determined by assigning values of said electric signal obtained sequentially to said shift function; and
wherein said control means terminates the etching process for said relatively thick portion when said actual etch quantity substantially coincides with said value.

10. A plasma etching system according to claim 9, wherein said measuring means includes:
- photoelectric transducer means for converting the interference light beam between said reflected laser light beams as received into said electric signal;
- reference function storage means for storing said reference function representing the relation between said electric signal and said etch quantity,
- a shift function generating unit for generating the relation expected between said electric signal and said etch quantity by shifting said reference function by a phase on the basis of said electric signal outputted from said photoelectric transducer means, and
- a second laser displacement meter for determining the actual etch quantity by assigning values of said electric signal outputted from said photoelectric transducer means to said shift function;
- a half mirror interposed between said second laser displacement meter and said jet nozzle of said plasma generating means for directing said laser light beam onto said relatively thick portion by way of said jet nozzle, said half mirror being so arranged as to direct the reflected light beam from said relatively thick portion to said second laser displacement meter by way of said jet nozzle; and
- a reflecting plate disposed in opposition to said second laser displacement meter with said half mirror being interposed between said reflecting plate and said second laser displacement meter.

11. A system for planarizing a surface of an article comprising:
- a plasma generator including a conduit, said conduit configured to direct a gas toward a portion of the article;
- a measuring apparatus including a laser displacement meter having a laser beam, said apparatus configured to direct said laser beam toward the portion through said conduit and receive said laser beam from the portion through said conduit.

12. The system according to claim 11, further comprising a mechanism to move the article relative to said conduit.

13. A method of planarizing a surface of an article, said method comprising the steps of:
- measuring the thickness of a film at a plurality of locations on the surface of the article;
- determining relatively thick portions of said film;
- storing said thickness information for said relatively thick portions and corresponding position information on a recording medium;
- placing a first thick portion proximate a plasma etch source, wherein said etch source includes a jet nozzle; and
- etching said first thick portion while simultaneously measuring a thickness of said film by directing a light beam through said jet nozzle.

14. The method according to claim 13, further comprising the steps of:

recalling said thickness and position information;

moving said plasma etch source proximate a second thick position; and etching said film at said second thick position.

15. The method according to claim 13, further comprising the step of determining an amount of material to remove by irradiating a reflecting surface and a surface of said thick portion, respectively, with the light beam and converting an interference light beam produced by interference between a reflected light beam from said reflecting surface and a reflected light beam from the surface of said thick portion into a corresponding electric signal.

* * * * *